United States Patent [19]

Samodovitz

[11] Patent Number: 4,629,927

[45] Date of Patent: Dec. 16, 1986

[54] ACOUSTICAL WAVE AIMER

[76] Inventor: Arthur J. Samodovitz, 1 Lakeshore Dr., Apt. A-4, Farmington, Conn. 06032

[21] Appl. No.: 536,337

[22] Filed: Nov. 22, 1983

Related U.S. Application Data

[63] Continuation of Ser. No. 380,104, May 20, 1982, abandoned.

[51] Int. Cl.[4] .................. H01L 41/08

[52] U.S. Cl. .................. 310/334; 310/311; 310/317; 310/319; 310/363; 310/366

[58] Field of Search .................. 310/311, 313 R, 313 B, 310/334–337, 363–366, 317, 319, 368, 358

[56] References Cited

U.S. PATENT DOCUMENTS

| | | | |
|---|---|---|---|
| 3,154,720 | 10/1964 | Cooperman | 310/311 X |
| 3,166,731 | 1/1965 | Joy | 310/334 X |
| 3,543,083 | 11/1970 | Sylvander | 310/311 X |
| 3,647,665 | 3/1972 | Lester | 310/311 X |
| 3,689,784 | 9/1972 | Klerk | 310/313 B |
| 3,739,201 | 6/1973 | Adler et al. | 310/311 |
| 4,417,169 | 11/1983 | Toda et al. | 310/317 |
| 4,446,396 | 5/1984 | Claus et al. | 310/317 X |
| 4,452,084 | 1/1984 | Taenzer | 310/334 X |

FOREIGN PATENT DOCUMENTS

| | | | |
|---|---|---|---|
| 43-27469 | 7/1964 | Japan | 310/363 |

*Primary Examiner*—Mark O. Budd

[57] ABSTRACT

The invention is an improvement to the linear array transducer and the annular array transducer. The improvement lies in the invention's capability to produce a phase shifted wave across each segment of the composite transducer and in so doing, better match the ideal phase shift for aiming or focussing acoustic waves.

The invention comprises transducer segments which each have at least one resistive electrode; the other electrode may be a standard highly conductive one. An electrical drive signal is applied to one border of each resistive electrode, and as the electrical drive signal propagates across the resistive electrode, it interacts with the capacitance of the piezoelectric element below and has its phase gradually shifted. As a result, the transducer segment produces an acoustic wave which has gradually varying phase, and this varying phase approximates the curvature of the ideal phase shift pattern.

31 Claims, 17 Drawing Figures

ACOUSTICAL WAVE AIMER

This is a continuation of application Ser. No. 380,104, filed May 20, 1982, now abandoned.

FIELD OF THE INVENTION

The invention relates to acoustic transducers and more particularly, to linear and annular array transducers which provide a smoothly phase shifted wave across each element of the array.

BRIEF DESCRIPTION OF THE PRIOR ART

The invention is useful in ultrasonic, or other acoustic imaging and nondestructive testing and scanning, and also for transmitting and receiving any mechanical waves. Ultrasonic imagers utilize a transducer to emit acoustical waves toward a specimen and receive the resultant echoes. Usually, the transmitted and received waves must be focussed and have means to variably aim the waves at different angles of propagation.

One conventional way to focus the waves is by an acoustic lens. This lens compensates for the difference in path lengths between the inner portions of the transducer and an axial target region, and the outer portions of the transducer and the same region; the inner portions path lengths are shorter. Another way is to utilize a variable phased or delayed annular array transducer having an axial disc shaped piezoelectric element and concentric, ring shaped piezoelectric elements. By progressively delaying the electrical drive signals more to the inner disc and rings that to the outer rings, the difference in path length between the target and each ring and disc are approximately compensated, and focussing is achieved. See Joy U.S. Pat. No. 3,166,731.

The major drawback of the conventional annular array is the uniformity of phase delay within each ring or disc whereas the actual path length continuously varies across each element. The ideal phase shift follows the perimeter of a circle which intersects opposite edges of the transducer and has its maximum deficit at the transducer's axis; the center of the circle is at the target focal zone.

The main advantage of the phased annular array over the standard lens focussing is that the acoustic lens provides only one focal distance whereas the phasing of the annular array can be varied to provide multiple focal distances. Thus, to provide multiple focal distances in a lens system, two or three lenses, each with different focal distances, must be utilized instead of just one. If they are interchanged by mechanical motion, this requires moving parts which wear out, create difficulty in interfacing the transducer-lens assembly to the target, cause gross waves which rock the target and slightly blur the image, and cause the transmitted signal to be slightly out of line with the return echo.

One embodiment of the invention provides an improved annular array transducer.

Another embodiment is an improved means to aim an acoustic wave. Here are two conventional techniques: First, the transducer can be physically moved by revolving it completely around an axis, and in the process making many transmit and receive "A" scans. Then, the co-planar "A" scans are combined by electronic processing to make a two dimensional "B" scan image. In this system, two or three transducers can be revolved around the axis at one time with each spaced 120 degrees apart. Each can have a lens with different focal distance if extended depth of field is desired. In another mechanical system, a single transducer is revolved only part way around, and then, turned around and brought back in a wobbling motion. During this mechanical, motion, "A" scans are made and electronically combined to construct a "B" scan. Both systems have the mechanical problems described above.

A second way to aim the the transducer is to utilize a linear array of transducer elements, with each one phase delayed a different amount in a progressive manner. With a series of long, rectangular shaped elements arranged in adjacent columns and the left most column having the most phase delay and the right most column having the least phase delay, the waves transmitted by each element will combine vectorily to produce a wave which aims to the left. See Joy U.S. Pat. No. 3,166,731. By changing the amount of progressive phase delay per element, the angle of transmission of the culminated wave (and the angle of receipt for echoes) can be varied.

One problem with the conventional phased linear array is that the width of each transducer segment is finite, usually 2-4 wavelengths at a minimum, and the phase delay of each transducer segment is fixed whereas an ideal aimed wave would have a continuously varying phase delay across each segment. This step-like change in phase across the face of the composite transducer therefore does not provide perfect aiming. The ideal phase shift per element if plotted versus displacement would appear as a slanted line if the target were very far, and for actual targets located closer to the transducer, the plot would resemble an arc of a circle which has been angled. One embodiment of the invention causes the phase shift across element to better approximate the ideal pattern.

SUMMARY OF THE INVENTION

It is a first object of the invention to provide a continuously varying phase shifted electrical excitation signal and transmitted wave across a transducer segment or lone transducer.

It is a second object of the invention to provide an improved annular or linear array transducer.

It is a third object of the invention to provide transducer segments in an annular or linear phased array which have phase shifts and delays which more closely resemble those require for ideal transmission of a focussed or aimed wave or both.

It is a fourth object of the invention to provide means to vary the rate of phase delay across each transducer element in order to aim or focus the transmitted waves at varying locations.

In accordance with these objects and others which will become apparent later in the disclosure there are provided transducer segments, shaped as components of a phased linear array or annular array, which have one resistive electrode and one highly conductive electrode, or two resistive electrodes, in place of standard transducers which have two highly conductive electrodes. Also, each transducer segment can be terminated with an electronic circuit having an impedance equal to that of the characteristic impedance of the transducer. The resistive electrode or electrodes provide a phase shift which varies continually across each transducer segment, and this phase shift is combined with progressive phase delay of the electrical excitation signals or receiver circuits for each segment to variably aim or focus the composite wave of the linear array or annular array, respectively.

BRIEF DESCRIPTION OF THE FIGURES

FIG. 2(*b*) shows a left to right cross section of the segment of FIG. 2(*a*) plus schematic termination circuits and driver and receiver circuits. FIG. 2(*c*) shows an equivalent circuit of the segment of FIG. 2(*a*) plus the circuitry of 2(*b*). FIG. 2(*d*) shows the phase shift across the 2(*a*) segment from left to right.

FIG. 3(*b*) shows one solid slanted line which represents the actual and ideal phase delay and shift pattern of the same two adjacent segments when aiming at a lesser angle. The phase shift within each segment is the same as in 3(*a*). The step like pattern represents the phase delay pattern of a conventional linear array. FIG. 3(*c*) shows six slanted solid lines which represent the phase delay and shift pattern of all six of the segments of the first embodiment when aiming at an angle zero with respect to the axis of the transducer. The straight line represents the ideal phase shift and delay pattern and that of a conventional linear array.

FIG. 6(*b*) shows an enlarged and more detailed top view of the central disc of the fourth embodiment. FIG. 6(*c*) shows a cross section, left to right, of the 6(*b*) central disc plus schematic termination circuits and amplifier and receiver circuits. FIG. 6(*d*) shows the phase shift pattern across the cross section of 6(*c*).

DETAILED DESCRIPTION OF THE FIRST EMBODIMENT

Figure 1:
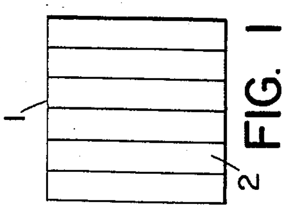
FIG. 1 shows the gross shape of a six segment linear array transducer in accordance with the first embodiment of the invention.
Figure 2B:
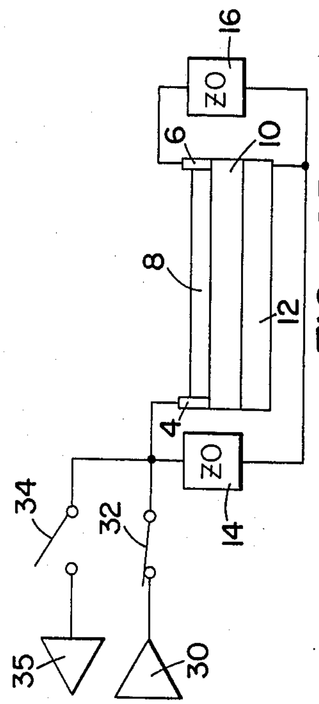
FIG. 2(*a*) shows an enlarged and more detailed top view of a segment of the first embodiment.
Figure 2C:
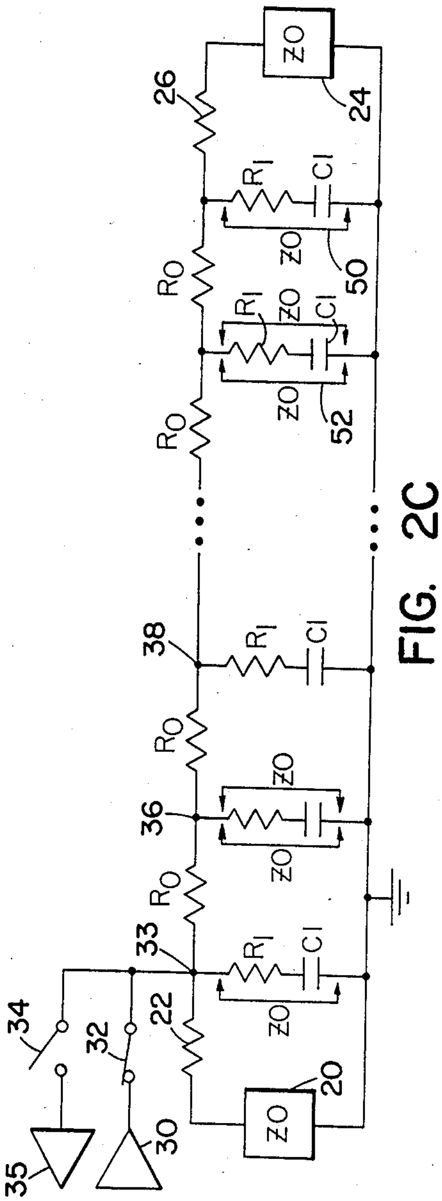
Figure 2A:
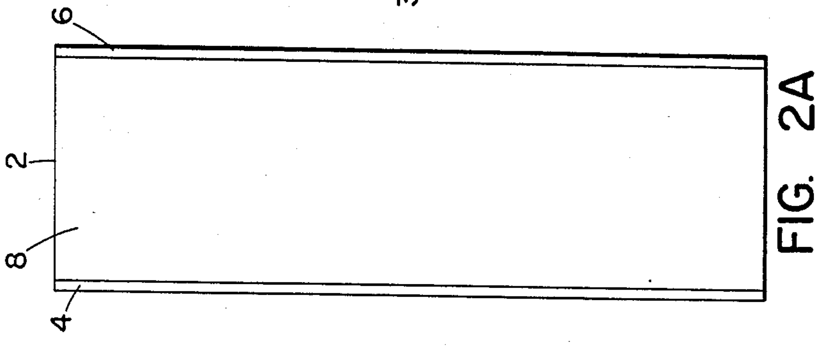
Figure 2D:
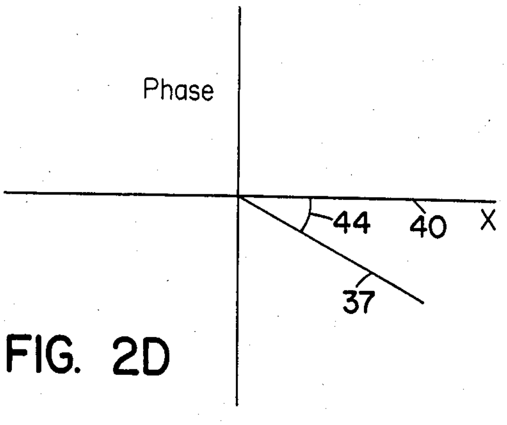

A six element structure of the first embodiment is shown in FIGS. 1 and 2. FIG. 1 shows a top view of its gross shape with the five vertical lines inside the outer two representing the separation slots between adjacent elements. FIG. 2(*a*) shows an enlarged and more detailed view of segment 2 of the first embodiment. On the left and right borders of element 2 are narrow, highly conductive electrodes 4 and 6, and in the middle is resistive electrode 8. Resistive electrode 8 consists of a very thin layer of metal, carbon, carbon mixed with metal, or some other resistive material. Highly conductive electrodes 4 and 6 consists of a thin layer of metal but thicker than that of the resistive layer if the same metal is used for them. All electrodes 4, 6, and 8 can be sputtered onto piezoelectric element 10 as well as highly conductive electrode 12 which is of conventional type. FIG. 2(*b*) shows a left to right cross section of element 2 and shows electrodes 4, 6, 8, and 12 in intimate contact with piezoelectric element 10.

Characteristic impedance termination circuits 14 and 16 connect between electrode 12 and strips 4 and 6, respectively. An electrical equivalent circuit is shown in FIG. 2(*c*) where R0 all along the top excluding resistors 22 and 26 represents the distributed resistance of resistive electrode 8. Resistors 22 and 26 have value equal to R0 and are added in the equivalent circuit to perfect the termination of the transducer. All the vertical R-C branches are equivalent with values R1 and C1 respectively, and represent the distributed resistance and capacitance of piezoelectric element 10 as if it were sandwiched between two highly conductive electrodes. The characteristic impedance, Z0, is the impedance as viewed across any one R1-C1 branch in either direction. The Z0 is constant because the equivalent circuit is terminated on either end by Z0+R0, the equivalent circuit termination circuit, element pairs 20 and 22, and 24 and 26. For the actual termination of transducer segment 2, a circuit with impedance, Z0, is used on either end.

Here are two ways to calculate Z0 and Z0+R0:

First model transducer segment 2 with the appropriate R0, R1, and C1 and insert in FIG. 2(*c*). The sum of resistors, R0, can be measured with a D.C. ohm-meter placed between the two highly conductive electrode strips 4 and 6. The composite values of R1 and C1 can be determined by sandwiching a similar piezoelectric element between two highly conductive electrodes and measuring the impedance between these two electrodes with a vector impedance meter. Or, the values of R1 and C1 can be calculated from known properties of the piezoelectric element. To calculate Z0, the equivalent circuit may have to be extended to include additional sections. Then, beginning with Z0 as an open circuit on the right end, compute the impedance looking across each R1-C1 branch, starting with the right most branch as indicated by arrow 50. Then compute the impedance looking across the adjacent R1-C1 branch as shown by arrow 52, and so on until you get far enough away from the termination so that it does not matter any more. At that point, several sections later, Z0 will be determined and the impedance calculated across subsequent R1-C1 branches will remain approximately constant.

A second way to determine Z0 is to make a very wide segment such as the composite transducer before it is cut into strips, and simply measure the impedance between left strip 4 and the highly conductive electrode 12. If the transducer is wide enough, this impedance equals Z0; if the transducer is not wide enough, then terminate it on the right end with the open circuit measurement. Then repeat the measurement. Then substitute this new impedance for the right hand termination, and so on until the measurements stabilize.

Amplifier 30 inputs via switch 32 to highly conductive electrode 4 at point 33 in the equivalent circuit. If the drive signal out of amplifier 30 must travel down a long transmission line before reaching the transducer, then a matching circuit (not shown) may be needed to match the impedance of the transducer element as viewed at point 33 to that of the transmission line. During the receive mode of the transducer, switch 32 is opened, switch 34 is closed, and receiver circuitry 35 is ready to receive the electrical signals generated by transducer segment 2 in response to the echo pressure waves. During the receive mode, characteristic impedance termination circuit 14 terminates the transducer as the received electrical signals flow toward it. If the input to the receiver presents a relatively low impedance, then it is part of the termination circuit on the left end.

As indicated by the equivalent circuit of FIG. 2(*c*), a drive signal, V1, applied at point 33 will proceed to the right and be effected by the parameters R0, R1, and C1. As a result, the voltage at node 36, $$V2 = V1 \times Z0/(R0 + Z0),$$

and the voltage at node 38, $$V3 = V2 \times Z0/(R0 + Z0).$$

Letting $Z0/(R0+Z0) = A\angle a$, $$V2 = V1 \times A\angle \text{and}$$

$$V3 = V2 \times A\angle a = V1 \times A^2\angle 2a.$$

Therefore, the phase of the signal varies linearly with respect to the horizontal distance from left strip 4. FIG. 2(*d*) shows this phase shift by slanted line 37; left strip 4 is at the origin, and right strip 6 is at point 40. Note the significance of characteristic impedance termination circuit 24 in providing this uniform impedance, Z0, when looking across any R1-C1 network, and the resultant linear phase shift. As a result of this lagging phase shift, segment 2 will emit a wave which aims to the right because such a target will receive the phase shifted transmitted wave in phase at all lateral locations of the wave; the linear phase shift compensates for the path length differential between the target and different parts of the segment 2. The compensation is only perfect if the target were infinitely far from the transducer, so in actual practice where the target distance is finite, the ideal phase delay has an arc shaped curvature superimposed on the slanted line. However, the linear phase shift of the first embodiment is very useful in approximating the ideal phase shift pattern.

Because the electrical drive signal attenuates according to the factor "A" derrived above, the amount of phase shift that can practically be implemented across a segment before the signal attenuates too much is limited. For example, a transducer with equivalent circuit lumped parameters of R0=4 ohms, R1=15 ohms, and C1 impedance=−j60, and including approximately eight sections will yield a signal at the right end of element 2 that lags the input signal by 126 degrees and is down 24 decibels.

Making the width of each transducer segment two milimeters or approximately four wavelengths at 2 Mhz, the phase shift line 37 of FIG. 2(*d*) has angle 44 equal to five degrees. This five degree phase shift is especially useful during the range −10 degrees to +10 degrees of wave angles of propagation; the negative angles of propagation are achieved by applying the input drive signal, V1, to and receiving from the right strip 6. Since the phase shift is fixed in the first embodiment, each segment will generally require variable phase delay or time delay to its input drive signal. This variable phase or time delay is the technique used in conventional linear arrays.

Figure 3A:
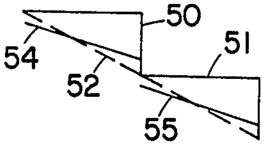
FIG. 3(*a*) shows two solid, slanted lines which represent the phase shift and delay pattern of two adjacent segments of the first embodiment when aimed at a certain angle. The phase shift slope and overall shift amount within each segment are the same. The slanted dashed line represents the ideal phase shift or delay, and the steplike pattern represents the phase delay pattern of a conventional linear array.
Figure 3B:
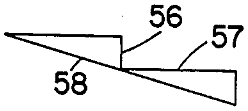
Figure 3C:

FIG. 3(*a*) shows two steps 50 and 51 which represent the phase delay or time delay relationship of the transmitted ultrasonic waves from two adjacent segments of a conventional linear array having two highly conductive electrodes. The resultant wave cause by the culmination of these two steps is ten degrees because the electrical transmit signal to the left segment is delayed 0.35 us, a time corresponding to 252 degrees. See Joy U.S. Pat. No. 3,166,731 for a discussion of culminating waves from a conventional linear array. The dotted line 52 represents the ideal phase time/delay relationship from a distant target to aim the wave at 10 degrees. Note that the conventional phase time/delay pattern deviates a maximum of 252 degrees from the ideal conditions. To utilize the first embodiment to aim at 10 degrees, the right segment of FIG. 3(*a*) has its input drive signal delayed 0.35 us (microseconds) from that of the left segment. Then, the phase delay pattern of the first embodiment shown by the solid slanted lines 54 and 55 deviates a maximum of only 63 degrees from the ideal because of the phase shift within each segment.

FIG. 3(*b*) shows two steps 56 and 57 which represent the phase delay/time pattern of the conventional linear array; the right segment is delayed 0.175 us or 126 degrees over the left segment, and deviates from the ideal phase delay pattern shown by the solid slanted line 58 by a maximum of 126 degrees. For five degree transmission, the right segment of FIG. 3(*b*) is delayed 0.175 us or 126 degrees over the left, and both provide the ideal phase delay pattern with zero deviation.

FIG. 3(*c*) shows a zero degree wave transmission of six segments of the first embodiment. The flat horizontal line 59 represents the conventional phase delay/time pattern which is also the ideal pattern. The saw tooth pattern 60 represents that of the first embodiment; the left most segment and every other one to the right have their respective drive signals input to their left edges, and the other segments have their drive signals input to their right edges; all these drive signals are delivered without time delay. This arrangement provides a maximum phase deviation of 63 degrees from the ideal pattern. In summary, the average maximum phase deviation of the conventional linear array for these three angles was 126 degrees and that of the first embodiment is only 42 degrees.

For the zero degree transmission (with respect to the axis of the transducer), each segment can also be driven of the same side, the left, with no other phase delay added by the drive signals, but this may produce some significant wave propagation at five degrees, and is therefore not recommended.

For other angles of transmission, an approproiate amount of delay is added to each segment. In general, when each segment is driven on the same side, either the right or left strips, the effective angle of transmission is based on the amount of delay persegment and the width of each segment. As stated earlier, this is only approximate because the ideal phase delay pattern for targets which are relatively close to the transducer is really an angled, arc pattern. For very snall angles of transmission, the technique of alternating the side of signal input can be used plus the appropriate delays.

For angles of transmission larger than ±10 degrees, the first embodiment is less effective in minimizing the phase deviation, but it is always 126 degrees better than the conventional step system. Therefore, the resultant image might have sharper resolution in the central region than in the side regions, but this may be especially useful for scanning a small object such as a suspect tumor or cyst or the carotid arteries.

As the width of each segment is decreased, the range of significantly improved scan angle is increased. Also, if the phase shift differential between the left and right strips 4 and 6 is increased, or if the wavelength of the transmitted waves is increased, so will be said scan angle range. The phase shift differential can be varied by selecting a resistive electrode and piezoelectric element such that R0, R1, or C1 are different. Preferably, the rate of phase shift is increased for a given attenuation. A computer can be used to test different values of R0, R1, and C1. Also, if the target is not a human being, but some inanimate, dense object such as a metal beam (this application may be for nondestructive testing for cracks in the metal), then the effective scan angle will be increased due to the higher density of the specimen and the resultant bending of the acoustic wave front.

Note that all six segments of the first embodiment will be delayed in a similar fashion to the two shown in FIGS. 3 (*a*) and (*b*), a progressive phase delay from segment to adjacent segment proceeding rightward, and that they all collectively culminate. See Joy. However, the extent of culmination of the waves of each segment should be effected positively by the phase delay within each segment and negatively by the attenuation within each segment which serves to isolate each segment from its neighbors. See Joy, page 3. To assist the culmination process, the segments should be separated by as narrow a slot as possible. In practice, a single transducer with a single, uniform resistive electrode will generally be made first. Then, parallel slots are cut to make the segments. The slots should go all the way through the resistive electrode, but need not go all the way through the piezoelectric element 10. The culmination or coalescing process is also aided by factors discussed in the description of the fourth embodiment, below.

The first embodiment can also have more or less segments than the six shown in FIG. 1, the more segments, the greater the total aperature size of the transducer and the better the resolution. The composite transducer should be square to make the resolution as symetric as possible, but other rectangular shapes are usable. It also does not matter which electrode, either resistive one 8 or highly conductive one 12, faces the target.

To receive the echoes and the resultant electrical signals generated by the transducer segments, switch 32 is opened and switch 34 is closed to connect the receiver 35 to highly conductive strip 4. In this configuration, the echoes which strike segment 2 (and the others) at different lateral distances from highly conductive electrode strip 4 induce electrical signals (generated by the transducer) which are progressively phase delayed as they propagate toward strip 4 and receiver 35. This progressive phase delay, as during transmission, compensates for the difference in path length between the target and different parts of each segment so that the resultant electrical signals combine along the segments resistive electrode in phase. The signals arriving at each receiving strip such as strip 4 are later combined electrically after the appropriate delay is added to those provided by each segment. This delay is analogous to that used during the transmit stage.

When the echoes strike each segment and cause electrical signals along each segment, some of the energy of those signals also propagates to the right and is dissipated in the right termination circuit such as 24. As it travels, it will also induce a slight stress in the transducer segment which is out of phase with the incident echo induced stress, but that caused by the rightward traveling electrical signal will be small in comparison due to the inefficiency of the transducer in converting mechanical to electrical energy and vice versa. Note that the transducer is polarized such that electrical signals applied across its electrodes directly induces a stress in that direction.

In a variation to the first embodiment in the receiving phase, a second transducer adjacent to the first can be used to receive the echoes. This second one can be analogous to the first or a conventional linear array.

Generally, focussing means is also needed and can comprise a separate acoustic lens or set of them. Or, each segment of the first embodiment can be divided into a column of smaller transducers, and focussing phase delays added to the electrical drive signals as in a standard annular array or as in the fourth embodiment of the invention.

The magnitude of the electrical drive signal applied to each segment is determined as in a standard linear array.

DETAILED DESCRIPTION OF THE SECOND EMBODIMENT

The second embodiment is similar to the first except the second embodiment does not have precise characteristic-impedance, termination circuits; instead, one version leaves each end open circuited. Using the parameters of the first embodiment equivalent circuit and removing elements 20, 22, 24, and 26, the phase shift per segment remains between seven and eleven degrees with most segments providing approximately ten degrees. This does not provide as consistant a phase shift pattern as the first embodiment but it is simpler and less expensive.

In a variation to this version, the termination circuit impedance is selected to vary the phase shift pattern in a favorable manner. For example, if segment 2 of the first embodiment was terminated with impedance 9 - j16 (13 - j16 in the equivalent circuit since R0 must be added), then the phase shift across the right most R0, R1, C1 section would be −11 degrees and the phase shift across R0, R1, C1 sections to the left would gradually lessen until the final value of −9.5 degrees phase shift per section was attained. This variation of the second embodiment can be used to provide a phase shift pattern which more closely matches the ideal pattern (for non-infinitely distant targets) because the ideal pattern has an arc shaped curvature to it; the variation in slope described above from −11 degrees to −9.5 degrees better resembles an angled arc (an arc superimposed on a slanted line) than a simple linear variation in phase shift.

DETAILED DESCRIPTION OF THE THIRD EMBODIMENT

Figure 4:
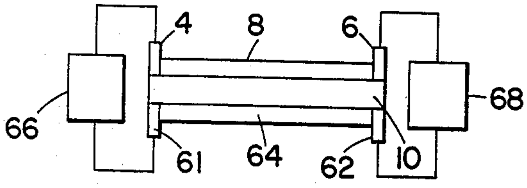
FIG. 4 shows a cross section of one segment of the third embodiment plus characteristic impedance termination circuits.

The third embodiment is similar to the first except highly conductive electrode 12 is replace by a resistive electrode 64 and highly conductive electrode strips 61 and 62, as shown in FIG. 4. Using an equivalent circuit which is similar to that of FIG. 2(*c*) except resistors, R2, are inserted in the bottom, horizontal line opposite to R0, the phase shift and attenuation per section, $$A'\angle a' = Z0/(R0+R2+Z0).$$

Characteristic impedance termination circuits 66 and 68 are calculated as in the first embodiment. The amplifier and receiver also connect to strip 4 through switches 32 and 34 as in the first embodiment, and strip 61 serves as their return.

DETAILED DESCRIPTION OF THE FOURTH EMBODIMENT

Figure 5:
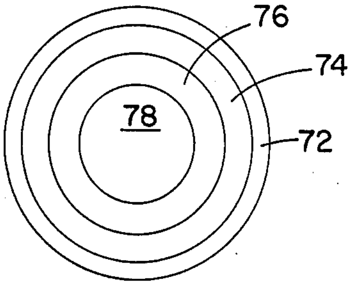
FIG. 5 shows the gross shape of a four segment annular array in accordance with the fourth embodiment. However, it is not drawn to scale.
Figure 6A:
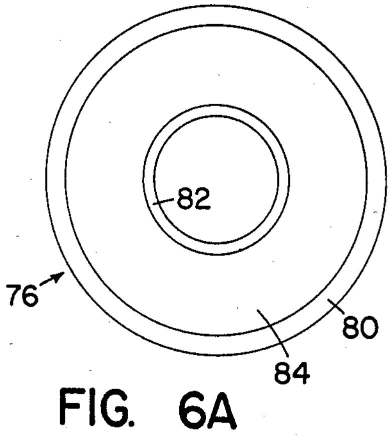
FIG. 6(*a*) shows an enlarged and more detailed top view of one ring of the fourth embodiment.
Figure 6B:
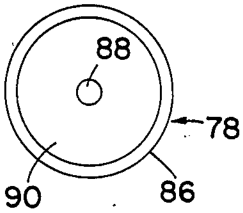
Figure 6C:
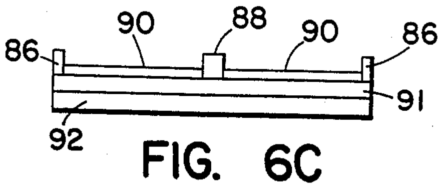
Figure 6D:
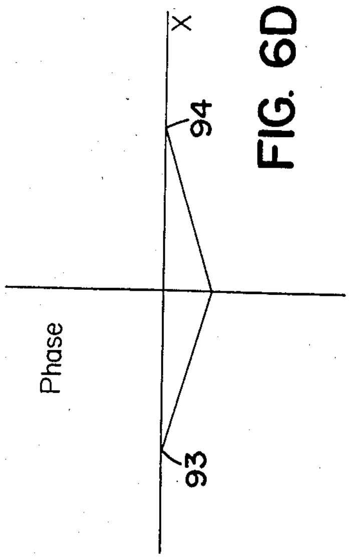

The fourth embodiment utilizes a resistive electrode and opposite, highly conductive metallic strips on each transducer component of an annular array. The gross shape of a four element annular transducer is shown in FIG. 5, and comprises three ring shaped transducer elements, 72, 74, and 76, and one central disc shaped transducer element 78. The three inner circles of FIG. 5 represent the separation slots between adjacent elements. FIG. 5 is not drawn to scale.

FIG. 6(*a*) shows one ring, 76, enlarged and in more detail, and comprises a highly conductive electrode 80 covering the outer periphery or outer, circular border of the underlying piezoelectric element which attaches through a common interface. The other highly conductive electrode, 82, covers the inner circular border of the piezoelectric element. Resistive electrode 84 covers the middle portion of the surface of the piezoelectric element and has surface area which is much larger than the combined surface area of both highly conductive electrodes 80 and 82. In fact, said highly conductive electrodes should be as narrow as possible.

The cross section of FIG. 2(*b*), in addition to portraying the first embodiment, also shows the left side of ring 76 along a horizontal line through the center of the ring. An amplifier, receiver, and termination circuits also connect to ring 76 in the fourth embodiment as shown in FIG. 2(*b*). FIG. 2(*c*) shows a circuit which also models the fourth embodiment ring 76, but it is less precise than in the modeling of the first embodiment. In the model of the fourth embodiment, an amplifier and receiver connect to ring 76 via highly conductive electrode 80.

One reason that FIG. 2(*c*) provides a lesser precise model of the fourth embodiment than the first embodiment is that each R0, R1, and C1 segment represents a narrow ring portion of ring 76, and each such subring is not uniform. Rather, each subring has different dimensions. Therefore, given a fixed width to each ring portion, the inner rings will have lesser surface area than the outer rings, and consequently a greater R0, 1, and capacitive impedance. However, since R0, R1, and C1 change in proportion and the phase angle depends on the ratio of these parameters, the phase change should be approximately linear from highly conductive strip 80 across to highly conductive strip 82, and should depend on Z0/(R0+Z0) as derrived earlier. Therefore, for simplicity, a model with uniform R0, R1, and C1 can be utilized to determine a usable termination circuit, and predict the attenuation and phase angle slope (which can later be measured).

FIG. 6(*b*) shows an enlarged and more detailed view of the inner disc transducer element 78 with highly conductive electrode strips 86 and 88, and resistive electrode 90. A model such as FIG. 2(*c*) can be used for simplicity also to demonstrate the phase shift and attenuation properties of disc transducer 90. FIG. 6(*a*) is not drawn to scale and all the highly conductive strips should be as narrow as possible. For all three rings and inner disc 78, the variation in R0, R1, and C1 will make it difficult to perfectly terminate either border. But, the termination circuit precision is not critical because the exact rate or linearity of phase shift is not critical; any sloped phase shift is substantially better than the uniform phase shift/delay per element of the conventional annular array. Here are some ways to select a usable termination impedance:

Using an impedance meter between strip 80 and the highly conductive electrode on the other face of the piezlelectric element, and open circuit termination at the other end, determine a first value for the termination circuit impedance. Then, utilize this impedance to terminate ring 76 between strip 82 and the highly conductive electrode on the other side of the piezoelectric element. Then, repeat the impedance measurement at strip 80, substitute this new vale for the termination circuit. Then, repeat this iterative procedure until the measured impedance stabilizes; when this occurs, a usable termination circuit impedance has been found.

Another procedure is to model a narrow, innermost ring portion of ring 76 having width approximately one fifth of the width of ring 76 with a single R0, R1, and C1 section representing the composite resistances and capacitance of said ring portion. Then, using these values, extend the equivalent circuit to several uniform sections and compute the characteristic impedance termination circuit Z0, of this equivalent circuit. Use this Z0 to terminate ring 76 on the strip 82 side. To calculate the Z0 for the other side 80, repeat this procedure but use R0, R1, and C1 which represent a narrow, outermost ring portion of ring 76.

In both cases, R0 can be determined from knowledge of the thickness, surface dimensions, and resistivity of the resistive electrodes corresponding to each said ring portion, or by a simple, DC ohmeter measurement of such ring portions between their outer and inner circular borders. Knowlege of the piezoelectric material properties and dimensions or experimental measurements between two, test, highly conductive electrodes sanwiching the piezoelectric element can be used to determine R1 and C1.

The termination impedances for inner disc 78 are determined in a similar manner. In the operation of disc 78, electrical signals are input to and received from highly conductive strip 86 via complementary switches. Highly conductive electrode 88 is terminated for the electrical drive signal and strip 86 is terminated for the echoes' electrical signals. As in the other transducer elements, an electrical signal applied to the outer circular border, will be phase shifted in a lagging manner as it propagates to the interior portions of element 78. FIG. 6(*c*) shows the cross section of inner disc 90; the first or top layer comprises electrodes 86, 88,and 90, the second layer comprises piezoelectric element 91, and the third layer comprises highly conductive electrode 92. All the layers intimately interface the adjacent layer or layers.

FIG. 6(*d*) shows the lagging phase shift across an imaginary line on the surface of disc 78 passing through its perpendicular axis. Points 93 and 94 on the x-axis correspond to opposite points on electrode 86, and the origin corresponds to the position of electrode 88.

Below is an example of one application of the fourth embodiment: There are three rings and one inner disc as shown in FIG. 5. The radius of disc 78 is 6 mm, the width of ring 76 is from 6.1 mm to 8.6 mm, the width of ring 74 is from 8.7 mm to 10.6 mm, and the width of ring 72 is from 10.7 mm to 12.3 mm. There is a 0.1 mm slot between each element, cut either partially or complete through. The frequency of the electrical drive signal is 2 Mhz. By a selection of a uniform homogenious piezoelectric material, having constant R1 and C1, and resistive electrodes being uniform within each ring or disc, but appropriately varied between rings or disc, the phase shift across each ring and disc is made to equal 90 degrees. The means to determine the appropriate resistive electrodes and piezoelectric material is described above.

The annular array has three focal distances, 110 mm, 150 mm, and 200 mm. For the 110 mm focal distance, the ideal phase shift across the entire transducer follows the arc of a circle whose center is along the axis of the transducer 110 mm away. The curve of FIG. 7(*a*) shows this ideal phase shift; the origin represents the axis of the transducer, and the x-axis represents a radius of the transducer. The four slanted lines represent the phase shift pattern across the respective rings or disc of the transducer. For a focal distance of 110 mm, the ideal phase shift per ring or disc is 121 degrees.

Since the phase shift across each ring is only 90 degrees, sufficient delay must be added to the electrical drive signal (and later, to the electrical received signal) of each ring or disc to make the phase delay pattern of each ring or disc best fit the ideal phase delay pattern. Therefore, disc 78 is delayed approximately 170 ns or 121 degrees over the drive signal to ring 76, ring 76 is delayed the same amount over ring 74, and ring 74 is delayed the same amount over ring 72. The resulting phase delay pattern is shown by the four slanted lines of FIG. 7(*a*). Note that the maximum deviation from the ideal curve for each ring is approximately 15 degrees whereas a conventional annular array would cause a maximum deviation of approximately 61 degrees.

Figure 7A:
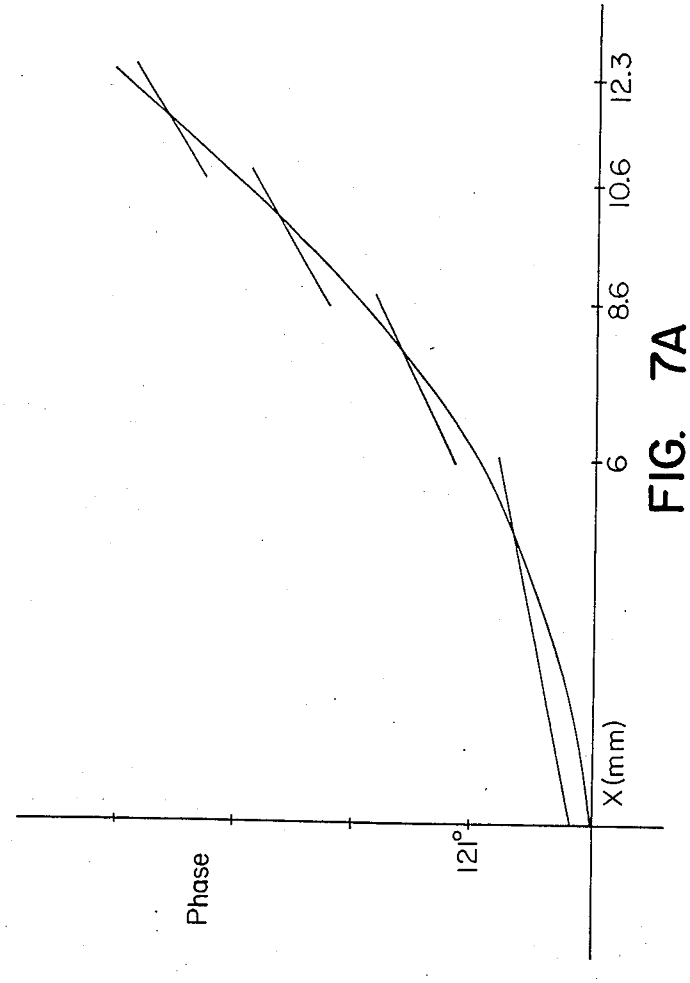
FIGS. 7(*a*), (*b*), and (*c*) shows phase shift and delay patterns of the embodiment in solid slanted lines when focussing at progressively further targets, respectively. The total phase shift within each segment is approximately constant. The curved lined in each figure is the perimeter of a circle whose center is the target region, and represents the ideal phase delay and shift pattern of each state of the transducer.
Figure 7B:
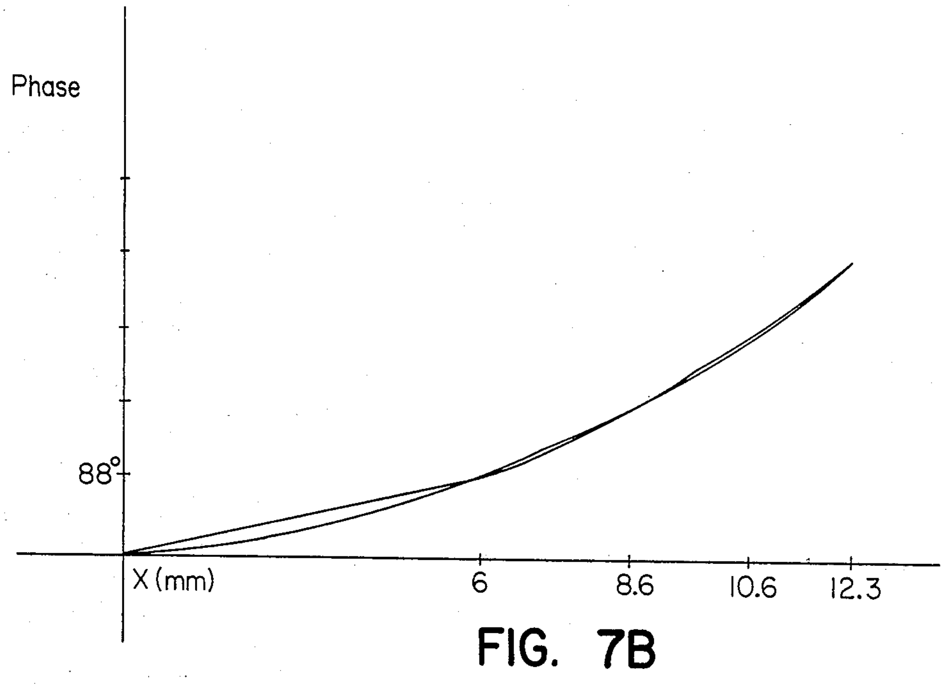
Figure 7C:
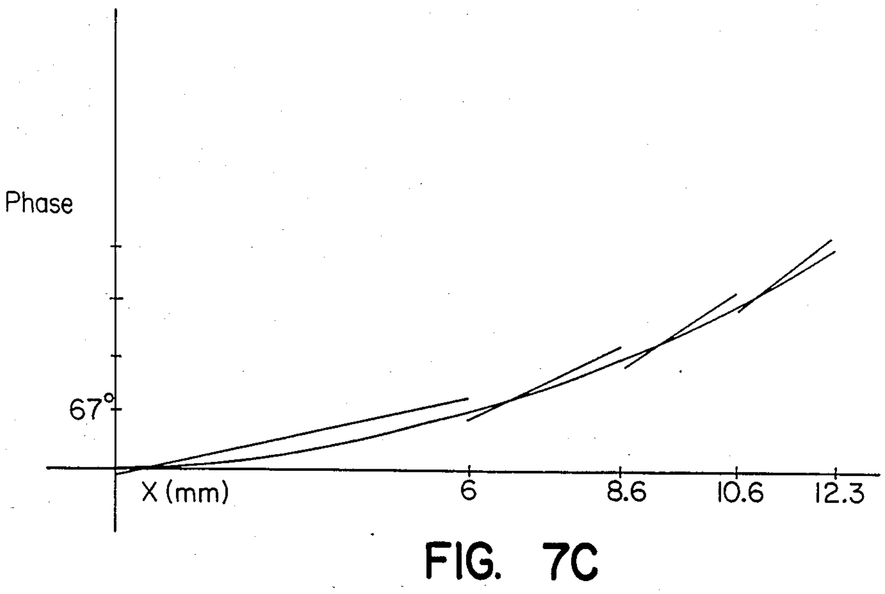

For a focal distance of 150 mm, the ideal phase shift pattern is shown by the arc shaped curve in FIG. 7(*b*) with approximately 88 degrees phase shift per ring or disc. With each ring and disc having an input drive signal progressively delayed 122 ns (nanoseconds) or 88 degrees over the adjacent outer one, the maximum phase shift deviation is approximately 1 degree. The four slanted lines of FIG. 7(*b*) show this close reproduction of the ideal curve by the phase shift pattern of the four segments. A conventional annular array would cause a maximum deviation of 44 degrees.

For a focal distance of 200 mm, the ideal phase shift pattern is shown by the arc shaped curve in FIG. 7(*c*) with approximately 67 degrees per ring displacement. With each disc ring's input drive signal delayed 67 degrees over its adjacent outer ring, the maximum phase shift deviation is approximately 6 degrees; the four slanted lines of FIG. 7(*c*) show this. A conventional annular array having rings and a disc with the same dimensions would cause a maximum phase shift deviation of 33 degrees.

Thus, by varying the phase delay of the electrical drive signal applied to each segment, selected focal lengths are obtained with minimal phase shift deviation from the ideal level. Note the attenuation of the electrical drive signal as it propagates across each ring or disc. This attenuation may inhibit the process of the culmination of the wave fronts from each segment into one resultant wave. The reason is that the attenuation may tend to isolate each segment. But, the sloped phase shift within each segment should assist the culmination process since there are less sharp changes in phase from segment to segment. Also, in a conventional annular array with steplike changes in phase from segment to segment, portions of each step must combine with the corresponding portion of an adjacent step in order for the resultant wave to angle in the correct direction. Therefore, in the conventional array, there seems to be the same separation distance as in the fourth embodiment between the portions of waves which must interact in order to achieve focussing. Therefore, the fourth embodiment may even provide superior culmination or coalescing than the conventional annular array. For the example above with R0, R1, and C1 having values the same or scaled versions as the first embodiment (depending on the radial distance from the transducer axis in the fourth embodiment), this 90 degree phase shift per segment is accompanied by a 17 decibel drop across each segment.

Note that phase delay and phase shift of the transmitted waves from and within each segment accomplish the same result—compensating for the different path lengths from each segment and within each segment to the target focal zone.

In the transducer described above having the different focal lengths, each ring or disc will likely need a resistive electrode with different thickness in order to vary the R0. To produce this, the whole transducer can be subject to a sputtering process which first applies the resistive electrode coat of the ring or disc with the thinnest required coat. Then, that electrode is covered, and additional sputtering is carried out until the remaining rings or disc obtain the thickness of the second thinnest electrode coat required, and so on until each ring and disc is properly coated.

The amount of power delivered by the electrical drive signal to each segment is determined according to standard procedure as applicable to conventional annular arrays. For example, the two inner elements 78 and 76 can receive the same magnitude of electrical drive power as each other, and the two outer rings 74 and 72 can receive the same amount as each other. Also, it is common practice in conventional annular arrays to excite the outer rings with less energy than the inner rings in order to attenuate side lobe energy radiation, and this practice can be applied to the fourth embodiment.

DETAILED DESCRIPTION OF THE FIFTH EMBODIMENT

The fifth embodiment is similar to the fourth except the dimensions of the ring and disc are varied, the inner disc has lesser radius, and the inner ring has two highly conductive electrodes sanwiched around its disc shaped piezoelectric element. These two highly conductive layers will cause the phase of the transmitted wave from the inner disc to be constant as in a conventional annular array, but the phase deviation can be tolerated since the ideal phase shift varies very gradually across the inner disc region. Then, as in the fourth embodiment, phase delay is added to the electrical drive signals (and received signals) of the outer rings. As in a conventional annular array, the phase pattern of the inner disc should place it half way up the ideal curve for the inner disc region so as to minimize phase deviation. The advantage of the fifth embodiment is the simplificiation of one of the disc electrodes. Note that the three rings of the fifth embodiment have resistive electrodes as in the fourth embodiment.

DETAILED DESCRIPTION OF THE SIXTH EMBODIMENT

The sixth embodiment is similar to the fourth except the resistive electrode of each segment is uniform. Because the resistance of the resistive electrode effects the phase shift slope, the dimensions of the rings and disc must be designed accordingly so that the actual phase shift and delay pattern does not deviate excessively from the ideal curve. Preferrably, the margin of error should be less than 20 degrees. The calculations of these dimensions require straightforward mathematics as taught by the detailed descriptions of the prior embodiments.

DETAILED DESCRIPTION OF THE SEVENTH EMBODIMENT

The seventh embodiment is similar to the fourth except the lower face of each transducer element also has a resistive electrode with highly conductive strips along their inner and outer borders as in the top electrode. The electrical drive signal is applied across the outer border strip of each electrode, and the received electrical signals are also measured between them. Across the outer circular borders and across the inner circular borders are the termination circuits. The phase shift and attenuation are based on $Z0/(R0+R2+Z0)$ as discussed in the description of the third embodiment where R2 similarly represents the resistive electrode of the lowest layer.

I claim:

1. A piezoelectric transducer comprising:
a piezoelectric element with opposite faces,
a resistive electrode attaching to one face,
an electrode attaching to the other face, said electrodes and piezoelectric element having a characteristic impedance, and
a circuit terminating said electrodes and piezoelectric element with approximately said characteristic impedance.

2. The transducer of claim 1 wherein the electrode of said other face is highly conductive.

3. The transducer of claim 1 further comprising highly conductive strips attaching substantially-all along a pair of opposite borders of said resistive electrode, said characteristic impedance circuit connecting to one strip, and the other strip receiving electrical drive signals.

4. An acoustical imaging device comprising:
a piezoelectric transducer comprising a rectangular piezoelectric element with opposite faces and polarized such that a voltage applied between said opposite faces will directly cause a stress between them; a resistive, rectangular electrode attaching directly to and covering more than half of one of said faces of the piezoelectric element; and another electrode attaching directly to and covering more than half of the other face of the piezoelectric element and further comprising
electrical transmitter means for delivering a short surge of electrical energy to said piezoelectric transducer causing it to transmit an acoustical wave, and
electrical imaging means for producing an image from echoes caused by said acoustical wave.

5. The transducer of claim 4 further comprising means for applying an electrical drive signal uniformly to one side of the piezoelectric element.

6. The transducer of claim 5 further comprising a highly conductive strip attaching all along one side of said resistive electrode, and a termination circuit attaching to said highly conductive strip for reducing electrical reflections.

7. An acoustical imaging device comprising:
a piezoelectric transducer comprising a first layer which includes a resistive electrode and a highly conductive electrode strip attaching along a border of said resistive electrode; a second layer which includes a substantially rectangular shaped piezoelectric element; and a third layer which includes an electrode, said first and
second layers being in contact with each other at a common interface and said second and third layers being in contact with each other at a common interface and further comprising
electrical transmitter means for delivering a short surge of electrical energy to said piezoelectric transducer causing it to transmit an acoustical wave, and
electrical imaging means for producing an image from echoes caused by said acoustical wave.

8. A linear array transducer comprising:
a plurality of closely spaced piezoelectric elements, each having a resistive electrode attaching directly to a face, each having another electrode attaching directly to an opposite face, and each having a highly conductive electrode strip attaching along a border of said resistive electrode, and
means for applying electrical drive signals to said highly conductive strips in a progressively delayed manner.

9. The transducer array of claim 8, wherein each piezoelectric element is substantially rectangular in shape.

10. A piezoelectric transducer comprising:
a ring shaped piezoelectric element,
a ring shaped resistive electrode attaching directly to a face of said piezoelectric element, and
a highly conductive electrode strip attaching to a circular border of said resistive electrode.

11. The transducer of claim 10 further comprising a termination circuit connecting to said highly conductive strip.

12. The transducer of claim 10 further comprising another electrode attaching directly to and covering more than half of an opposite face of said piezoelectric element.

13. An annular array transducer comprising:
a plurality of concentric, ring shaped piezoelectric elements, . . . and
a central disc shaped piezoelectric element within the center space of the innermost piezoelectric ring.

14. The transducer array of claim 12 further comprising a disc shaped resistive electrode attaching to one face of the disc shaped piezoelectric element.

15. The transducer array of claim 13 further comprising two disc shaped highly conductive electrodes attaching to opposite faces of said disc shaped piezoelectric element.

16. The transducer array of claim 13 further comprising a narrow, ring shaped, highly conductive electrode strip attaching along one circular border of each said resistive electrode.

17. A transducer for transmitting and aiming acoustical waves comprising:

a piezoelectric element with opposite faces, a resistive electrode attaching to one face, an electrode attaching to the other face, said electrodes and piezoelectric element together having a characteristic impedance, and a characteristic-impedance circuit terminating said electrodes and piezoelectric element with said characteristic impedance.

18. The transducer of claim 17 wherein the electrode of said other face is highly conductive.

19. The transducer of claim 17 wherein the electrode of said other face is resistive.

20. The transducer of claim 17 further comprising highly-conductive strips attaching all along opposite sides of said resistive electrode, said characteristic-impedance circuit connecting to one strip, and an electrical power source connecting to the other strip.

21. A transducer for transmitting and aiming acoustical waves comprising:

a rectangular piezoelectric element with opposite faces and a thickness measured between them, said piezoelectric element polarized such that a voltage applied between said opposite faces will directly change said thickness, a resistive, rectangular electrode attaching directly to and covering at least 80% of the total electroded portion of one face of said piezoelectric element, highly-conductive, metallic strips attaching all along two opposite sides of said resistive electrode, and a highly-conductive, metallic, rectangular electrode attaching directly to and covering substantially all of the total electroded portion of the other face of said piezoelectric element.

22. The transducer of claim 21 wherein said piezoelectric element, said resistive electrode, and said highly-conductive electrode are each substantially square.

23. A transducer and circuit for transmitting and aiming acoustical waves comprising:

a first layer comprising an electrode, a second layer comprising a piezoelectric element, a third layer comprising an electrode, said first and second layers being in contact with each other at a common interface, said second and third layers being in contact with each other at a common interface, and a variable impedance, wave aiming circuit connecting to one of the electrodes.

24. A piezoelectric transducer comprising:

a round piezoelectric element, a disc shaped, highly conductive electrode substantially coaxial with the piezoelectric element and attaching directly to a face of the piezoelectric element, and a ring shaped, resistive electrode attaching directly to said face of the piezoelectric element and surrounding the disc shaped electrode, the resistance of the resistive electrode made large enough to cause a phase shift of at least three degrees and an attenuation of at least two decibels when an electrical signal propagates radially across the ring shaped, resistive electrode.

25. The transducer of claim 24 wherein the resistance of the resistive electrode is made large enough to cause a phase shift of at least six degrees and an attenuation of at least four decibels when an electrical signal propagates radially across the ring shaped, resistive electrode.

26. An acoustical imaging device comprising:

a piezoelectric transducer comprising a disc shaped piezoelectric element; means, comprising a disc shaped resistive electrode attaching directly to a face of said piezoelectric element, for causing an electrical signal to propagate radially of and adjacent to said face of said piezoelectric element and for causing said electrical signal to phase shift at least three degrees and attenuate at least two decibels while propagating radially across said face; and an electrode attaching directly to the opposite face of the piezoelectric element and further comprising electrical transmitter means for delivering said electrical signal to said piezoelectric transducer causing it to transmit an acousitical wave, said electrical signal comprising a short surge of electrical energy, and electrical imaging means for producing an image from echoes caused by said acoustical wave.

27. The transducer of claim 27 wherein the resistance of the resistive electrode is made large enough to cause a phase shift of at least six degrees and an attenuation of at least four decibels when an electrical signal porpagates radially across the disc shaped, resistive electrode.

28. The transducer of claim 26 further comprising a highly conductive strip attaching along substantially all the outer border of the resistive electrode.

29. The transducer of claim 27 wherein the transducer has a characteristic impedance, and further comprising a highly conductive strip attaching along substantially all the outer border of the resistive electrode, and a circuit connecting to said highly conductive strip and terminating the transducer with approximately said characteristic impedance.

30. The transducer of claim 29 further comprising a highly conductive strip attaching along substantially all the outer border of the resistive electrode, and an electrode attaching to the other face of the piezoelectric element.

31. The transducer of claim 20 wherein the resistive electrode, underlying piezoelectric element, and electrode of said other face have a characteristic impedance, and further comprising a circuit terminating the transducer with approximately said characteristic impedance.

* * * * *